United States Patent [19]

Ohba et al.

[11] Patent Number: 4,976,198
[45] Date of Patent: Dec. 11, 1990

[54] GRAIN STRUCTURE FOR LITHOGRAPHIC PRINTING PLATE SUPPORTS

[75] Inventors: Hisao Ohba; Kazutaka Oda; Hirokazu Sakaki; Akira Shirai; Azusa Ohashi, all of Shizuoka, Japan

[73] Assignee: Fuji Photo Film Co., Ltd., Kanagawa, Japan

[21] Appl. No.: 8,121

[22] Filed: Jan. 23, 1987

Related U.S. Application Data

[63] Continuation of Ser. No. 652,420, Sep. 19, 1984, abandoned, which is a continuation of Ser. No. 135,395, Mar. 31, 1980, abandoned.

[30] Foreign Application Priority Data

Aug. 16, 1979 [JP] Japan .............................. 54-104473

[51] Int. Cl.$^5$ ............................................. B41N 1/08
[52] U.S. Cl. ................................. 101/459; 204/129.4
[58] Field of Search ..................... 101/459; 204/129.4

[56] References Cited

U.S. PATENT DOCUMENTS

| | | | |
|---|---|---|---|
| 993,938 | 5/1911 | Achert | 101/401.1 |
| 2,344,510 | 3/1944 | Hagelin | 101/459 |
| 3,223,032 | 12/1965 | Boardman | 101/459 |
| 3,887,447 | 6/1975 | Shearby | 204/129.4 |
| 3,935,080 | 1/1976 | Gumbinner | 101/459 |
| 4,072,589 | 2/1978 | Golda | 204/129.4 |
| 4,152,158 | 5/1979 | Chu | 101/459 |

FOREIGN PATENT DOCUMENTS

| | | | |
|---|---|---|---|
| 1956795 | 5/1971 | Fed. Rep. of Germany | 101/459 |
| 2912060 | 10/1979 | Fed. Rep. of Germany | 101/459 |
| 12928 | 4/1973 | Japan | 101/459 |
| 53907 | 5/1976 | Japan | 101/459 |
| 30503 | 3/1977 | Japan | 101/459 |
| 121801 | 9/1979 | Japan | 101/459 |

*Primary Examiner*—Clifford D. Crowder
*Attorney, Agent, or Firm*—Sughrue, Mion, Zinn, Macpeak & Seas

[57] ABSTRACT

A support for a lithographic plate produced by a process which comprises:

mechanically roughening the surface of an aluminum plate, chemically etching about 5 to 20 g/m$^2$ of aluminum from the surface of the plate, and applying an alternating wave-form electric current to the plate in an acidic aqueous solution such that the quantity of electricity generated with the plate as the anode is equal to or greater than the quantity of electricity generated with the plate as the cathode, electrolysis being carried out such that the current density when the plate is the anode is not less than about 20 A/dm$^2$ and the quantity of electricity generated with the plate as the anode is about 200 coulombs/dm$^2$ or less.

8 Claims, 2 Drawing Sheets

GRAIN STRUCTURE FOR LITHOGRAPHIC PRINTING PLATE SUPPORTS

This is a continuation of application Ser. No. 652,420, filed Sept. 19, 1984, which is a continuation of application Ser. No. 135,395, filed Mar. 31, 1980, both now abandoned.

BACKGROUND OF THE INVENTION

1. Field of the Invention

The present invention relates to supports for lithographic printing and to a process for producing the same. Particularly, it relates to aluminium plates having a rough surface for lithographic printing plates and a process for producing the same.

2. Description of the Prior Art

In order to use aluminium plates as supports for lithographic printing plates, the surface is generally roughened to improve adhesion to a sensitive layer provided thereon and to improve the water retention property. The treatment for roughening the surface is called graining, and mechanical graining such as ball graining, wire graining, brush graining, etc., and electrochemical graining, i.e., electrolytic etching have been known.

Since the aluminium surface grained by these processes is comparatively soft and easily abraded, it is subjected to anodic oxidation to form an oxide film thereon. The resulting surface of the processed aluminium plate is hard and exhibits excellent abrasion resistance, good affinity for water, good water retention and good adhesion to the photosensitive layer. However, when anodic oxidation alone is carried out after the graining directly after the mechanical graining, the oxide film is blackened by insoluble substances (for example, the remnants of abrasives, aluminium cutting dusts or brush fragments, etc.) formed during graining treatment and, consequently, the appearance is damaged. Further, the sensitivity of a sensitive layer applied thereto deteriorates or becomes uneven, the visual contrast between the image and the non-image areas is poor even with development and, consequently, and further operations are indispensable for plate making, such as correction or elimination, etc. Moreover, not only operations in printing, for example, control of water/ink balance, etc., become difficult, but also the non-image area is easily contaminated. For this reason an intermediate treatment is generally carried out after graining and before anodic oxidation. As the intermediate treatment, a chemical etching process is described in U.S. Pat. No. 3,834,998 and an electrochemical etching process is described in U.S. Pat. No. 3,929,591. In the case of electrochemical etching, though the treated surface is somewhat white compared with the aluminium surface subjected to graining and then anodic oxidation, halation does not substantially occur and the sensitivity is low and interferes with post-development operations such as correction or elimination of images. Further, printing operations (e.g., adjustment of balance between water and ink, etc.) become difficult to accomplish.

In the case of chemical etching, though contamination of the non-image area and resistance to scratching are improved, a fine grain structure formed on the aluminium surface is broken. Therefore, the excellent surface characteristics of the graining treatment deteriorate, water retention and printing durability become inferior and fine halftone dots of 1 to 5% cannot be reproduced.

SUMMARY OF THE INVENTION

Accordingly, a first object of the present invention is to provide supports for lithographic printing plates having excellent affinity for water and water retention properties and a process for producing the same.

Another object of the present invention is to provide supports for lithographic printing plates which form lithographic printing plates having improved printing durability and a process for producing the same.

A further object of the present invention is to provide supports for lithographic printing plates which form photosensitive lithographic printing plates having high sensitivity and an excellent plate inspection property.

As a result of extensive studies directed to attaining the above-described objects, it has been found that the micro-structure of the fine uneven surface observed on an aluminium support when magnified, for example, 2,000 to 5,000 times, has a very large influence on the qualities of the plate as a support for lithographic printing plates. Thus, the present invention provides:

(1) A support for a lithographic printing plate comprising an aluminium plate which has a rough surface having mounds and pits on the surface thereof and a grain structure wherein said mounds and pits are uniformly dispersed and have the structure described below; and (2) A process for producing a support for a lithographic printing plate which comprises:

mechanically graining the surface of an aluminum plate, chemically etching about 5 to 20 g/m$^2$ aluminum from the surface of the plate, and applying an alternating wave-form electric current to the plate in an acid aqueous solution such that the quantity of electricity generated with the plate as the anode is greater than the quantity of electricity generated with the plate as the cathode, electrolysis being carried out such that the current density when the plate is the anode is not less than about 20 A/dm$^2$ and the quantity of electricity generated with the plate as the anode is about 200 coulombs/dm$^2$ or less.

DETAILED DESCRIPTION OF THE INVENTION

The present invention is illustrated in detail with reference to accompanying drawings.

Figure 1:
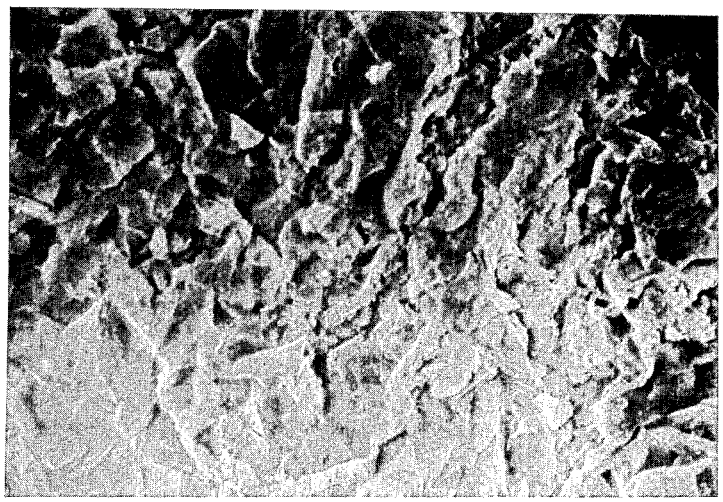
FIG. 1 (a) is a microscopic photograph of the surface of a mechanically grained aluminium plate enlarged 2,000 times and FIG. 1 (b) is a cross-sectional representation of the surface in FIG. 1 (a).
Figure 1:

FIG. 1 (a) is a photograph of the surface of aluminium plate grained by brush graining process, which is enlarged 2,000 times by a scanning electron microscope, and FIG. 1 (b) is a cross-sectional representation of this surface. It is understood from FIG. 1 (b) that the surface of the aluminium plate roughened by brush graining is a continuous wave composed of hills and valleys having various cycles and amplitudes. In the figure, the wave having the comparatively long cycle is called a primary structure and the wave having a short cycle is called a secondary structure. A feature of the rough surface of a brush-grained aluminium plate is that the secondary structure is formed on the primary structure is such a density that the face of the primary structure itself does not remain. (The term "face of the primary structure" refers to what would be the unpitted undulations in FIG. 1 (b).) Moreover, the direction with which the pits in the secondary structure pierce the primary structure is random and the pits have a complicated two- or three-dimensional arrangement, though this cannot be shown in the two dimensions in FIG. 1 (b). Such a complicated secondary structure is a predominant feature of the rough surface of the mechanically grained aluminium plate. Accordingly, since the surface has such a complicated structure, supports for lithographic printing plates resulting from anodic oxidation of this surface have the above-described faults.

Figure 2:
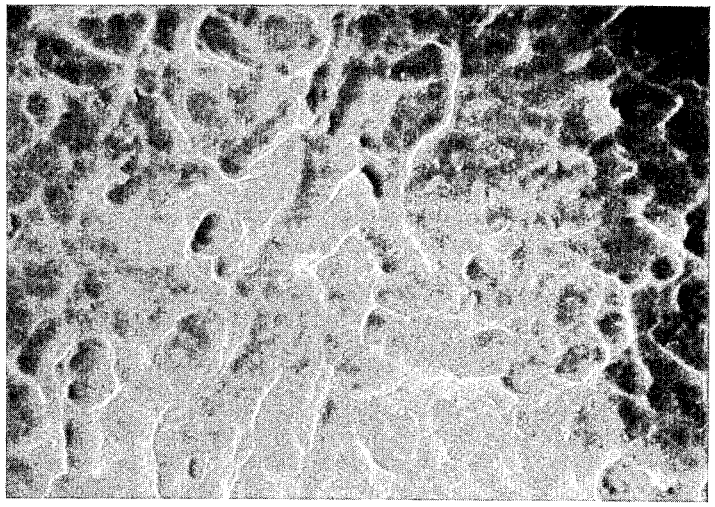
FIG. 2 (a) is a microscopic photograph of the surface of an aluminium plate enlarged 2,000 times which was chemically etched after mechanical graining and FIG. 2 (b) is a cross-sectional representation of the surface in FIG. 2 (a).
Figure 2:

FIG. 2 (a) is a photograph of the surface of an aluminium plate which was chemically etched after mechanical graining enlarged 2,000 times by a scanning electron microscope. FIG. 2 (b) is a cross-sectional representation of the surface. As shown in FIg. 2 (b), the secondary structure in the surface of the mechanically grained aluminium plate disappears and a gently-sloping undulation (hereinafter, referred to as a mound) is formed.

The aluminium plate which is subjected to chemical etching after mechanical graining has a surface having high whiteness upon anodic oxidation, and a lithographic printing plate with little contamination of non-image areas can be obtained. However, since the secondary structure disappears, image portions on the lithographic printing plate easily peel from the surface of the support under the physical forces of printing and, consequently, the printing durablity deteriorates.

Figure 3:
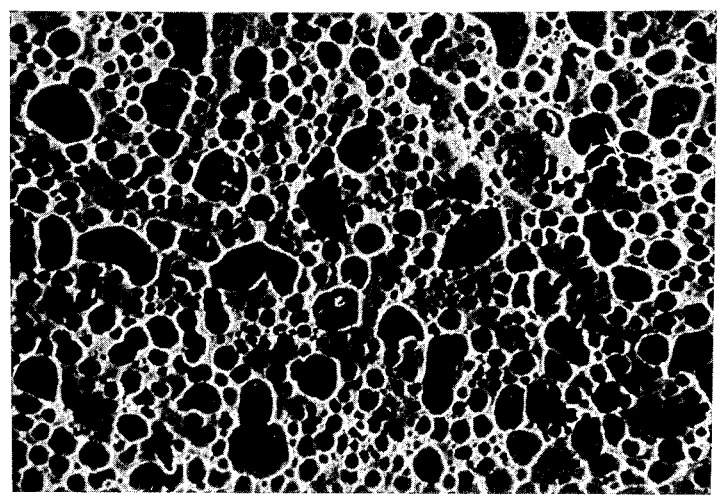
FIG. 3 (a) is a microscopic photograph of the surface of an aluminium plate enlarged 2,000 times which was electrolytically treated after first mechanical graining and then chemical etching treatments and FIG. 3 (b) is a cross-sectional representation of the surface in FIG. 3 (a).
Figure 3:
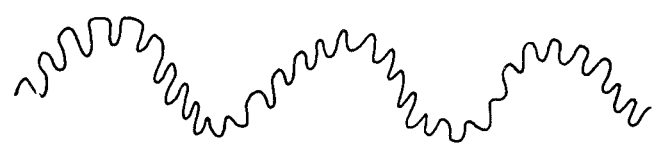

FIG. 3 (a) is a photograph of the surface of an aluminium plate which was subjected to electrolytic etching treatment after first mechanical graining then chemical etching treatments, enlarged 2,000 times by a scanning electron microscope. FIG. 3 (b) is a cross-sectional representation of the surface. As is obvious from FIGS. 3 (a) and (b), a new secondary structure is formed in place of the secondary structure formed by mechanical graining on the surface of the aluminium plate in which the primary structure formed upon chemical etching after mechanical graining predominates. This new secondary structure is remarkably different from the above-described secondary structure (i.e., the secondary structure formed by mechanical graining), because the direction with which the pits pierce the mound face is nearly perpendicular thereto and the pits are comparatively sparsely dispersed, namely, occur with such a frequency that the mounds remain though the pits are uniformly present.

Since the aluminium plate having the secondary structure shown in FIGs. 3 (a) and (b) has high whiteness upon anodic oxidation, a photosensitive lithographic printing plate having a sensitive layer provided thereon provides high sensitivity, and a lithographic printing plate obtained therefrom has the advantage that presence of unnecessary image areas can be easily distinguished by the high contrast between the image areas and non-image areas. Further, this lithographic printing plate has high printing durability, because the image areas do not peel off during printing due to the pits making up the secondary structure. Further, since the pits composing the secondary structure are dispersed at such a density that the mounds remain, a lithographic printing plate having little contamination in the non-image areas is produced. Further, the fact that the piercing direction of pits composing the secondary structure is simple as compared with the case of the secondary structure formed by mechanical graining is one of reasons the lithographic printing plate having little contamination as described above can be produced.

This electrochemical graining is preferably carried out so that the pore diameters corresponding to 5% and 95% pore diameter on the cumulative frequency curve of the grain formed are respectively 3 $\mu$ or less, preferably 0.5 to 3 $\mu$ and 7 $\mu$ or less, preferably 5 to 7 $\mu$. Further, the preferred density of the pits is $10^6$ to $10^8$ pits cm$^{-2}$.

In spite of the recognition that an aluminum plate with a grain falling within the above range provided on the surface thereof is, as described in British Patent Publication No. 2,019,022 A, not suitable for use as a support for a lithographic printing plate, it has now surprisingly been found that the aluminum plate with such a grain produced by a combination of the mechanical graining and the electrochemical graining according to the process of this invention is usable as an excellent support for the lithographic printing plate. Additionally, since the formation of the surface with such a grain by the electrochemical graining is relatively easy, the process of this invention is markedly advantageous from the standpoint of production.

The above pore diameter cumulative frequency curve can be obtained by magnifying the surface of a piece of the electrochemically grained aluminum plate 100 to 700 times by the use of a scanning type electron microscope, for example, measuring the diameters and number of pores in a unit area, and then plotting the pore diameter ($\mu$) as the abscissa and the cumulative frequency (%) as the ordinate.

The process for producing supports for lithographic printing plates according to the present invention is illustrated in detail below.

The aluminium plate used in the present invention includes pure aluminium plates and aluminium alloy plates. As aluminium alloys, various alloys can be used. For example, there are alloys of aluminium and metals such as silicon, copper, manganese, magnesium, chromium, zinc, lead, bismuth or nickel, etc. These compositions may contain impurities in amounts which can be disregarded in addition to some iron and titanium.

Specific examples of the suitable aluminum alloys are set forth in the following Table below wherein all numerical figures are in terms of percent by weight.

| Al Alloy No. | Cu | Si | Fe | Mn | Mg | Zn | Cr | Ti | Al |
|---|---|---|---|---|---|---|---|---|---|
| 1050* | 0.05 | 0.25 | 0.40 | 0.05 | 0.05 | 0.05 | — | 0.03 | >99.5 |
| 1100* | 0.05–0.20 | 1.0 | | 0.05 | — | 0.10 | — | — | >99.0 |
| 3003 | 0.05–0.20 | 0.6 | 0.7 | 1.0–1.5 | — | 0.10 | — | — | balance |
| 2024 | 3.8–4.9 | 0.5 | 0.5 | 0.3–0.9 | 1.2–1.8 | 0.25 | 0.10 | — | balance |
| 5052 | 0.10 | 0.45 | | 0.10 | 2.2–2.8 | 0.10 | 0.15–0.35 | — | balance |
| 6061 | 0.15–0.40 | 0.40–0.8 | 0.7 | 0.15 | 0.8–1.2 | 0.25 | 0.04–0.35 | 0.15 | balance |
| 7075 | 1.2–2.0 | 0.40 | 0.5 | 0.30 | 2.1–2.9 | 5.1–6.1 | 0.18–0.35 | 0.20 | balance |

*The amounts other than that of Al show maximum.

Prior to mechanical graining, the aluminium surface is generally de-greased and the aluminium surface is treated in order to expose a clean aluminium surface. For the former purpose, solvents such as trichloroethylene, etc., and surface active agents are used. For the latter purpose, an alkali etching process using agents such as sodium hydroxide or potassium hydroxide has been widely used. Unless the rolling oil adheres strongly, the degreasing treatment prior to mechanical graining can be omitted.

In the present invention it is possible to use electrochemical graining (electrolytic etching) which comprises graining by sending an electric current through an electrolyte comprising hydrochloric acid or nitric acid, mechanical graining processes such as wire-brush graining which comprises scratching the aluminium surface with metal wires, ball graining which comprises graining the aluminium surface with abrasive balls and abrasives, or brush graining which comprises graining the surface with a nylon brush, etc. However, a brush graining process is preferred because it is suitable for continuous mass production. However, the surface structure which is a characteristic of the present invention cannot be obtained by utilizing any of the above-described processes for graining or combinations thereof alone. The grained surface consists of a fine structure (secondary structure) which is smoothed by chemical etching and a roughened face (primary structure) which is not destroyed by the chemical etching.

Among these procedures, the brush graining is particularly preferred. Details of the brush graining is described in Japanese Patent Publication No. 40047/75 and U.S. Pat. No. 3,891,516.

The graining is preferably carried out so that the center line average roughness (Ra) of the support be 0.4 to 1.0 $\mu$. The center line average roughness as herein used is, as illustrated in JIS-B 0601-1970, given in microns by the following equation:

$$Ra = \frac{1}{L} \int_0^l f(x)\,dx$$

wherein l is a length taken from the roughness curve in the direction of the center line, and yf(x) is the roughness curve with the center line of the length taken as the X axis and the longitudinal direction taken as the Y axis.

The degree of the mechanical graining to provide the above defined Ra range can be easily determined by one skilled in the art when the conditions of the electrochemical graining to be applied subsequently and of other additional processings to be applied as necessary are determined.

The aluminium plate subjected to graining treatment is then chemically etched with an acid or an alkali. In the case of using the acid as an etching agent, a very long period of time is required to destroy the fine structure and, consequently, it is industrially disadvantageous for carrying out the present invention. The process can be improved using the alkali as the etching agent.

As the alkali agent suitably used in the present invention, there are sodium hydroxide, sodium carbonate, sodium aluminate, sodium metaborate, sodium phosphate, potassium hydroxide and lithium hydroxide, etc. Preferable concentration and temperature ranges are 1 to 50% by weight and 20° to 100° C., respectively, and it is particularly preferred to use a condition that dissolves Al in an amount about 5 to 20 g/m². By etching 5 g/m² or more of the Al, a rough face consisting of the primary structure itself, namely, mounds can be formed.

After etching, acid washing is carried out in order to remove smut on the surface. As the acid, nitric acid, sulfuric acid, phosphoric acid, chromic acid, hydrofluoric acid and borofluoric acid are used.

The aluminium plate treated as described above is then subjected to electrolytic etching in order to form a new secondary structure. This treatment is carried out by electrolyzing the plate in an acid aqueous solution of, for example, hydrochloric acid, nitric acid or a mixture thereof, with 200 coulombs/dm² or less of electricity being supplied at a current density not less than 20 A/dm² while the plate is an anode using a suitable counter electrode such as a graphite or aluminium plate, etc., so that the quantity of electricity with the plate as an anode (referred to as Qa hereinafter) is larger than the quantity of electricity with the plate as a cathode (referred to Qc hereinafter).

Figure 4:
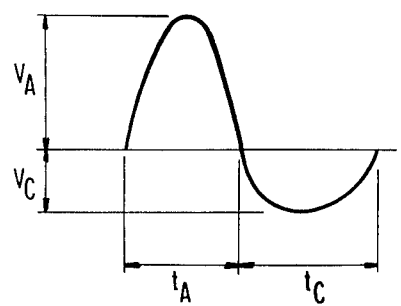
FIG. 4 is a view of voltage wave forms, wherein (a) is a sine wave, (b) is a rectangular wave and (c) is a trapezoidal wave.
Figure 4:
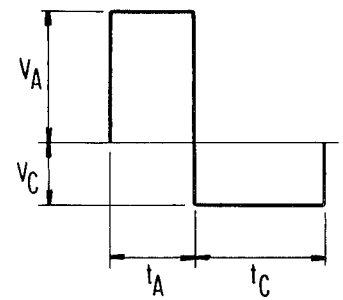
Figure 4:
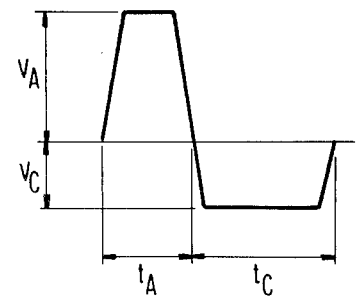

The alternating wave-form electric current used in the present invention is a wave-form obtained by alternately changing the polarity of positive and negative electrodes, and any wave-form may be used as long as Qa is equal to or greater than Qc. A preferred voltage wave-form giving such a current wave-form is one in which the anodic voltage (Va) is larger than the cathodic voltage (Vc). FIG. 4 shows typical voltage wave-forms among preferred voltage wave-forms, wherein (a) is a sine wave, (b) is a rectangular wave and (c) is a trapezoidal wave. In these cases, it is preferred to set the anodic half-cycle period (FIG. 4, $t_A$) so that it is equal to or less than the cathodic half-cycle period (FIG. 4, $t_C$). By changing the ratio Qc/Qa by regulating the voltage and the current density, the micro-structure of the porous surface (the diameter and density of pits) can be suitably controlled. Further, when "Va" is constant and "Vc" increases, the diameter of the pits tend to increase. Conversely, when "Vc" is constant and "Va" increases, the diameter of the pits tend to decrease. The pit diameter also tends to increase as the temperature of the treatment increases or the current density increases. It is thus possible to produce a grained surface whose pore diameters corresponding to 5% and 95% of the pore diameter cumulative frequency curve of the grain formed are respectively 3 μor less and 7 μor less.

In the present invention, it is necessary to carry out the above-described electrolytic treatment in such a manner that the pits are uniformly dispersed on the above-described mounds but the mounds (primary structure) remain.

If the pits are formed over the entire surface so that the mounds disappear, the characteristic that nonimage areas are difficult to soil is lost. If the pits are not uniformly distributed or they are formed in local gatherings, it becomes difficult to obtain suitable printing durability and tonal reproduction.

As the electrolytic bath, a solution of one or more of hydrochloric acid or salts thereof and nitric acid or salts thereof may be used. If necessary, inhibitors and stabilizers such as amines described in U.S. Pat. No. 3,755,116, sulfuric acid described in U.S. Pat. No. 3,980,539, boric acid described in Japanese Patent Application (OPI) No. 41653/76 (the term "OPI" as used herein refers to a "published unexamined Japanese patent application") and phosphoric acid described in German Patent Application (OLS) No. 2250275, etc., may be added to the above-described solution.

The electrolyte can be used at a concentration of about 0.1 to 4% by weight. Further, values of Va and Vc suitable for producing the desired grain structure are both in the range of about 1 to 50 V and preferably about 5 to 30 V. Further, each of Qa and Qc is in the range of 200 coulombs/dm$^2$ or less and preferably about 70 to 200 coulombs/dm$^2$. If it is more than 200 coulombs/dm$^2$, contamination of the non-image areas is difficult to prevent. The temperature of the treatment is usually between about 10° C. and about 45° C., preferably about 15 to 45° C.

In order to uniformly disperse the pits, the ratio Qc/Qa is preferably in the range of about 0.5/1 to 1.0/1 and more preferably about 0.7/1 to 0.95/1. It is necessary that the anodic current density upon electrolysis is about 20 A/dm$^2$ or more and preferably about 25 to 70 A/dm$^2$. If the anodic current density is less tan about 20 A/dm$^2$ and the quantity of anodic electricity is less than 200 coulombs/dm$^2$, it is difficult to maintain adequate printing durability, water retention and the reproduction of fine halftone dots.

The aluminium plate treated as described above can be used as a support for lithographic printing plates as is, but it may be further processed by anodic oxidation treatment or chemical treatment.

The anodic oxidation treatment may be carried out just after water wash of the aluminium plate treated as described above, but it is preferred to carry out desmutting in order to remove the smut, which forms on the surface of the electrolytically treated aluminium plate. Desmutting is carried out by contacting the surface of the aluminium plate with an aqueous solution of acids or alkalis by, for example, dipping. Examples of the acids include phosphoric acid, sulfuric acid and chromic acids and mixtures thereof. As the alkalis, it is possible to use the same substances as used in the chemical etching after mechanical roughening treatment. Among them, a particularly preferred desmutting process comprises contacting the support with sulfuric acid at a concentration of about 15 to 65% by weight at 50 to 90° C. as described in Japanese Patent Application (OPI) No. 12739/78. The alkali etching process described in Japanese Patent Publication No. 28123/73 can also be used.

Anodic oxidation can be carried out by a known process. For example, it is possible to form an anodic oxidation film on the surface of the aluminium plate by applying a direct current or an alternating current to the aluminium plate in an aqueous solution or a non-aqueous solution of one or more of sulfuric acid, phosphoric acid, chromic acid, oxalic acid, sulfamic acid and benzenesulfonic acid, etc.

Though the conditions vary according to the electrolyte used, it is generally preferred that the concentration of the electrolyte is about 1 to 80% by weight, the liquid temperature is about 5° to 70° C., the current density is about 0.5 to 60 amperes/dm$^2$, the voltage is about 1 to 100 V and the electrolysis time is about 30 seconds to 50 minutes.

As the anodic oxidation treatment, it is particularly preferred to use a process which comprises carrying out anodic oxidation in sulfuric acid at a high current density described in British Patent No. 1,412,768 and a process which comprises carrying out anodic oxidation using phosphoric acid as an electrolytic bath as described in U.S. Pat. No. 3,511,611.

The aluminium plate subjected to anodic oxidation may be processed by dipping in an aqueous solution of alkali metal silicate, for example, sodium silicate, as described in U.S. Pat. Nos. 2,714,066 and 3,181,461 or may be provided with an undercoating layer composed of hydrophilic cellulose (e.g., carboxymethyl cellulose, etc.) containing water-soluble metal salts (e.g., zinc acetate, etc.) as described in U.S. Pat. No. 3,860,426.

On the supports for the lithographic printing plates of the present invention, a known photosensitive layer may be formed to produce photosensitive lithographic printing (Pre-sensitized plates). These lithographic printing plates have excellent properties.

Compositions for the above-described photosensitive layer include the following.

(1) A sensitive layer composed of a diazo resin and a binder;

As a negative working photosensitive diazo compound, a so-called photosensitive diazo resin, i.e., a condensation product of formaldehyde and diphenylamine-pdiazonium salt which is the reaction product of a diazonium salt and an organic condensing agent containing a reactive carbonyl group, such as aldol and acetal as disclosed in the specifications of U.S. Pat. Nos. 2,063,631 and 2,667,415 is preferably used. Other useful condensed diazo compounds are disclosed in Japanese Patent Publication Nos. 48001/74, 45322/74 and 45323/84. These photosensitive diazo compounds are usually obtained in the form of water-soluble inorganic salts and hence the compounds can be coated as an aqueous solution thereof. Moreover, these water-soluble diazo compounds may be converted into the corresponding substantially water-insoluble diazo resins by the reaction thereof with aromatic or aliphatic compounds having one or more phenolic hydroxy groups and/or sulfo groups by the method disclosed in Japanese Patent Publication No. 1167/72 and the water-insoluble photosensitive diazo resins thus prepared can be used in the photosensitive layer.

Examples of the reaction products having phenolic hydroxy groups described above are diphenol acids such as hydroxybenzophenone, 4,4-bis(4'-hydroxyphenyl)pentanic acid, resorcinol, and diresorcinol and they may have substituents. Hydroxybenzophenones include 2,4-dihydroxybenzophenone, 2-hydroxy-4-methoxybenzophenone, 2,2'-dihydroxy-4,4'-dimethoxybenzophenone, and 2,2',4,4'-tetrahydroxybenzophenone. As preferred sulfonic acids, there are aromatic sulfonic acids such as benzenesulfonic acid, toluenesulfonic acid, xylenesulfonic acid, naphthalenesulfonic acid, phenolsulfonic acid, naphtholsulfonic acid, and benzophenonesulfonic acid as well as the soluble salts thereof, e.g., the ammonium salts and alkali metal salts thereof. The sulfonic acid-containing compounds may be substituted, generally by a lower alkyl group, a nitro group, a halo group, and/or other sulfo group. Preferred examples of these compounds are benzenesulfonic acid, toluenesulfonic acid, naphthalenesulfonic acid, 2,5-dimethylbenzenesulfonic acid, sodium benzenesulfonate, naphthalene-2-sulfonic acid, 1-naphthol-2- (or 4)-sulfonic acid, 2,4-dinitro-1-naphthol7-sulfonic acid, 2-hydroxy-4-methoxybenzophenone-5-sulfonic acid, sodium m-(p'-anilinophenylazo)benzenesulfonate, alizarinsulfonic acid, o-toluidine-m-sulfonic acid, and ethanesulfonic acid. The sulfonic acid esters of alcohols and the salts thereof are also useful. Such compounds are usually readily available as anionic surface active agents. Examples of them are the ammonium salts or alkali metal salts of lauryl sulfate, alkylaryl sulfate, p-nonylphenyl sulfate, 2-phenylethyl sulfate, isooctylphenoxydiethoxyethyl sulfate, etc.

These substantially water-insoluble photosensitive diazo resins are prepared and collected as precipitates by mixing the aforesaid water-soluble photosensitive diazo resins and an almost equivalent of an aqueous solution of the above-mentioned aromatic or aliphatic compounds.

The diazo resins described in British Patent No. 1,312,925 can also be used.

The most preferred diazo resin is 2-methoxy-4-hydroxy-5-benzoyl benzenesulfonate which is the condensation product of p-diazophenylamine and formaldehyde.

It is proper that the diazo resin is present in the photosensitive layer in an amount of about 5 to 50% by weight. If the content of the diazo resin is less, the photosensitivity increases as a matter of course but the storage stability is reduced. The optimum content of the diazo resin is from about 8% by weight to about 20% by weight.

On the other hand, various high molecular weight compounds can be used as binders but in this invention, binders having hydroxy group, amino group, carbon group, amido group, sulfonamido group, active methylene group, thioalcohol group, epoxy group, etc., are preferably used. Examples of the preferred binders are shellac described in British Patent No. 1,350,521; the polymers containing a hydroxyethyl acrylate unit or a hydroxyethyl methacrylate unit as the recurring unit as described in British Patent No. 1,460,978 and U.S. Pat. No. 4,123,276; the polyamide resins described in U.S. Pat. No. 3,751,257; the phenol resins and the polyvinyl acetal resins such as, for example, polyvinylformal resin, polyvinylbutyral resin, etc., described in British Patent No. 1,074,392; the linear polyurethane resins described in U.S. Pat. No. 3,660,097; phthalated resins of polyvinyl alcohol; epoxy resins formed by the condensation of bisphenol A and epichlorohydrin; polymers containing amino group, such as polyaminostyrene and polyalkylamino acrylate or methacrylate; and cellulose derivatives such as cellulose acetate, cellulose alkyl ether, cellulose acetate phthalate, etc.

The composition comprising the diazo resin and the binder may further contain additives such as the pH indicator as described in British Patent No. 1,041,463; phosphoric acids as described in U.S. Pat. No. 3,236,646; and dyes.

(2) Photosensitive layer comprising o-quinonediazide compound

Preferred o-quinonediazide compounds are o-naphthoquinonediazide compounds and they are described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443 as well as other many publications. Among these compounds, the o-naphthoquinone diazidosulfonic acid esters or o-naphthoquinonediazidocarboxylic acid esters of aromatic hydroxy compounds and o-naphthoquinonediazidosulfonic acid amides or o-naphthoquinonediazidocarboxylic acid amides of aromatic amino compounds are particularly preferred. In particular, the esterification product of o-naphthoquinonediazidosulfonic acid and the condensation product of pyrogallol and acetone described in U.S. Pat. No. 3,635,709; the esterification product of a polyester having a terminal hydroxy group and o-naphthoquinonediazidosulfonic acid or o-naphthoquinonediazidocarboxylic acid described in U.S. Pat. No. 4,028,111; the esterification product of a homopolymer of p-hydroxystyrene or a copolymer thereof and other copolymerizable monomers and o-naphthoquinonediazidosulfonic acid or o-naphthoquinonediazidocarboxylic acid as described in British Patent No. 1,494,043; and the amido reaction product of a copolymer of p-aminostyrene and other copolymerizable monomer and o-naphthoquinonediazidosulfonic acid or o-naphthoquinonediazidocarboxylic acid described in U.S. Pat. No. 3,759,711 are excellent.

These o-quinonediazide compounds may be used alone but they are preferably used together with an alkalisoluble resin. Preferred alkali-soluble resins are novolak-type phenol resins. Practically, there are phenol/formaldehyde resins, o-cresol/formaldehyde resins, and m-cresol/formaldehyde resins. Furthermore, as is described in U.S. Pat. No. 4,123,279, it is more preferred to use the above-described phenol resins together with a condensation product of formaldehyde and a phenol or cresol substituted by an alkyl group having 3 to 8 carbon atoms, such as a t-butylphenol formaldehyde resin. The content of the alkali-soluble resin is from about 50 to about 85% by weight, preferably from about 60 to 80% by weight based on the total weight of the composition constituting the photosensitive layer.

The photosensitive composition comprising the oquinonediazide compound may, if necessary, contain additives such as dyes, plasticizers, and the components for imparting print out faculty as described in, for example, British Patents Nos. 1,041,463 and 1,039,475 and U.S. Pat. No. 3,969,118.

(3) Photosensitive layer comprising an azide compound and binder (polymer)

As the photosensitive compositions for the photosensitive layer, there are the compositions comprising azide compounds and water-soluble or alkali-soluble polymers described in, for example, British Patents Nos.

1,235,281 and 1,495,861 and Japanese Patent Application (OPI) Nos. 32331/76 and 36128/76 as well as the compositions comprising polymers having azide groups and polymers as binders described in Japanese Patent Application (OPI) Nos. 5102/75, 84302/75, 84303/75 and 12984/78.

(4) Other photosensitive resin layers:

These materials include photosensitive resins such as the polyester compounds disclosed in, for example, Japanese Patent Application (OPI) No. 96696/77; the polyvinyl cinnamate resins described in British Patents Nos. 1,112,277, 1,313,390, 1,341,004 and 1,377,747; and photopolymerizable type photopolymer compositions described in U.S. Pat. Nos. 4,072,528 and 4,072,527.

The amount of the photosensitive layer formed on the support is from about 0.1 to about 7 g/m$^2$, preferably about 0.5 to 4 g/m$^2$.

A presensitized printing plate is imagewise exposed and then processed by conventional processing steps including development to form resin images. For example, in the case of a presensitized plate having the above-described photosensitive layer (1) comprising the diazo resin and the binder, after processed by a conventional process comprising development to form a resin image. For example, in case of a presensitized plate having the above-described photosensitive layer (1) comprising a diazo resin and a binder, the unexposed areas of the layer are removed by development after imagewise exposure to light, to produce a lithographic printing plate. In the case of a plate having photosensitive layer (2), the exposed area is removed by development using an aqueous solution of an alkali, after imagewise exposure to light, to produce a lithographic printing plate.

The present invention is illustrated in more detail by reference to the following Example, in which all percentages are by weight.

EXAMPLE

After an aluminium sheet having 99.5% purity was subjected to graining by a revolving nylon brush in an aqueous dispersion of pumice, it was etched using a 20% aqueous solution of sodium hydroxide so as to dissolve 8 g/m$^2$ aluminium. After adequately washing the plate with water, it was washed with a 25% aqueous solution of nitric acid and ten again with water to prepare a support.

The resulting plate was electrolyzed in an aqueous nitric solution (7 g/l) at 22° C. using an alternating wave form using the rectangular wave shown in FIG. 4 (b) under the condition shown in Table 1. It was then dipped in a 15% aqueous solution of sulfuric acid at 50° C. for 3 minutes to clean the surface. Then, an anodic oxide film of 3 g/m$^2$ was formed with using a 10% aqueous solution of sulfuric acid to produce Samples a, B, C, D and E.

On the resulting samples, the following photosensitive layer was provided at a coverage of 2.5 g/m$^2$ (dried).

| | |
|---|---|
| Esterified compound of naphthoquinone-1,2-diazide-5-sulfonyl chloride and pyrogallol acetone resin (described in Example 1 in U.S. Pat. No. 3,635,709) | 0.75 g |
| Cresol Novolak Resin | 2.00 g |
| Oil Blue 603 (produced by Orient Chemical Co.) | 0.04 g |
| Ethylene Dichloride | 16 g |
| 2-Methoxyethylacetate | 12 g |

The resulting photosensitive lithographic printing plate was imagewise exposed to light for 60 seconds at a distance of 1 m using a 3 kw metal halide lamp, and it was then developed using an aqueous solution of sodium silicate having a molar ratio SiO$_2$/Na$_2$O of 1.2 and an SiO$_2$ content of 1.5%. When printing was carried out in a conventional manner using the resulting lithographic printing plate, the results shown in Table 1 were obtained.

TABLE 1

| | (Sample A) | (Sample B) | (Sample C) | (Sample D) | (Sample E) | (Sample F) |
|---|---|---|---|---|---|---|
| Amount of etching | 8 (g/m$^2$) | 8 | 8 | 8 | 8 | 8 |
| Condition of electrolysis | | | | | | |
| Anodic current density | 35 (A/dm$^2$) | 20 | 15 | 15 | — | 15 |
| Anodic quantity of electricity | 176 (coulomb/dm$^2$) | 176 | 176 | 400 | — | 1,000 |
| Qc/Qa | 0.73 | 0.72 | 0.73 | 0.76 | — | 0.71 |
| Va | 23 (volts) | 14 | 10 | 11 | — | 35 |
| Vc | 12 (volts) | 8 | 6 | 7 | — | 17 |
| Amount of anodic oxidation film | 3 (g/m$^2$) | 3 | 3 | 3 | 3 | 3 |
| Cumulative frequency curve | | | | | | |
| 5% | 2 ($\mu$) | 2.5 | 2 | 3 | — | 4 |
| 95% | 5 ($\mu$) | 6.5 | 7 | 7 | — | 14 |
| Density of secondary structure (third) | 7 × 10$^7$ (pit/cm$^2$) | 3 × 10$^7$ | 0.5 × 10$^7$ | 17 × 10$^7$ | Absence | |
| Degree of pits uniformly dispersed in the secondary structure | Good | Good | Bad (non-uniform) | Bad (over-density) | Absence | Bad (over-density) |
| Mound | Presence | Presence | Absence | Absence | Presence | Absence |
| Printing durability | 100,000 (sheets) | 100,000 | 60,000 | 100,000 | 60,000 | 60,000 |
| Contamination | Excellent | Excellent | Good | Bad | Excellent | Bad |
| Remarks | Invention | Invention | Comparison | Comparison | Comparison | Comparison |

While the invention has been described in detail and with reference to specific embodiments thereof, it will be apparent to one skilled in the art that various changes and modifications can be made therein without departing from the spirit and scope thereof.

What is claimed is:

1. A support for a lithographic printing plate comprising an aluminum sheet, the surface of which has a grain structure, as observed upon magnifying 2,000 times under a scanning electron microscope comprising mounds and pits, wherein the pits each have a defined opening and uniformly pierce the surface of said mounds in a direction nearly perpendicular to the surface of said mounds and are present in such a sparse uniform density that a substantial proportion of the surface of the mounds is still apparent, wherein the surface of the mounds is the small region between the pits on a large mound, wherein the pits are produced by electrolytic etching, wherein the distribution of pit diameters is such that the pits corresponding to 5% and 95% on a cumulative frequency curve for pit diameters are 3μ or less, and 7μ or less, in diameter, respectively, and wherein said pits are present in a density of $10^6$ to $10^8$ pits/cm².

2. The support as in claim 1, wherein the distribution of pit diameters is such that the pits corresponding to 5% and 95% on a cumulative frequency curve for pit diameters are 0.5 to 3 μ and 5 to 7 μ, respectively.

3. The support as in claim 1, wherein said surface further has an anodic oxide layer formed thereon.

4. A support as claimed in any of claims 1, 2, or 3, wherein a center-line average roughness of said surface is 0.4 to 1.0 μ.

5. A presensitized printing plate comprising a photosensitive layer on a support, wherein said support comprises an aluminum sheet, the surface of which has a grain structure, as observed upon magnifying 2,000 times under a scanning electron microscope, comprising mounds and pits, wherein the pits each have a defined opening and uniformly pierce the surface of said mounds in a direction nearly perpendicular to the surface of the mounds, and are present in such a sparse uniform density that a substantial proportion of the surface of the mounds is still apparent, wherein the surface of the mounds is the small region between the pits on a large mound, wherein the pits are produced by electrolytic etching, wherein said support has a distribution of pit diameters such that the pits corresponding to 5% and 95% on a cumulative frequency curve for pit diameters are 3μ or less, and 7μ or less, in diameter, respectively, wherein said pits are present in a density of $10^6$ to $10^8$ pits/cm².

6. A presensitized printing plate comprising a photosensitive layer on a support, wherein said support comprises an aluminum sheet, the surface of which has a grain structure, as observed upon magnifying 2,000 times under a scanning electron microscope, comprising mounds and pits, wherein the pits each have a defined opening and uniformly pierce the surface of said mounds in a direction nearly perpendicular to the surface of the mounds, and are present in such a sparse uniform density that a substantial proportion of the surface of the mounds is still apparent, wherein the surface of the mounds is the small region between the pits on a large mound, wherein the pits are produced by electrolytic etching, wherein said support has a distribution of pit diameters such that the pits corresponding to 5% and 95% on a cumulative frequency curve for pit diameters are 3μ or less, and 7μ or less, in diameter, respectively, wherein said pits are present in a density of $10^6$ to $10^8$ pits/cm² and wherein a center-line average roughness of said surface is 0.4 to 1.0μ.

7. The presensitized printing plate as as claimed in any of claims 5 or 6, wherein the distribution of pit diameters is such that the pits corresponding to 5% and 95% on a cumulative frequency curve for pit diameters are 0.5 to 3 μ and 5 to 7 μ, respectively.

8. The presensitized printing plate as claimed in any of claims 5 or 6, wherein said surface further has an anodic oxide layer formed thereon.

* * * * *